United States Patent [19]

Shin et al.

[11] Patent Number: 5,885,867
[45] Date of Patent: Mar. 23, 1999

[54] METHODS OF FORMING HEMISPHERICAL GRAINED SILICON LAYERS INCLUDING ANTI-NUCLEATION GASES

[75] Inventors: Hyun-bo Shin; Jong-young Kim, both of Kyungki-do, Rep. of Korea

[73] Assignee: Samsung Electronics Co., Ltd., Rep. of Korea

[21] Appl. No.: 984,310

[22] Filed: Dec. 3, 1997

[51] Int. Cl.⁶ .............................................. H01L 21/8242
[52] U.S. Cl. ........................ 438/255; 438/396; 438/398
[58] Field of Search .................................. 438/253, 254, 438/255, 396, 398

[56] References Cited

U.S. PATENT DOCUMENTS

| | | | |
|---|---|---|---|
| 5,234,862 | 8/1993 | Aketagawa et al. | 437/103 |
| 5,366,917 | 11/1994 | Watanabe et al. | 437/47 |
| 5,372,962 | 12/1994 | Hirota et al. | 437/47 |
| 5,385,863 | 1/1995 | Tatsumi et al. | 437/109 |
| 5,394,012 | 2/1995 | Kimura | 257/739 |
| 5,405,801 | 4/1995 | Han et al | 437/60 |
| 5,464,791 | 11/1995 | Hirota | 437/60 |
| 5,486,488 | 1/1996 | Kamiyama | 437/60 |
| 5,543,347 | 8/1996 | Kawano et al. | 437/60 |
| 5,554,557 | 9/1996 | Koh | 437/52 |
| 5,567,637 | 10/1996 | Hirota | 437/43 |
| 5,590,051 | 12/1996 | Yokozama | 364/496 |
| 5,595,937 | 1/1997 | Mikagi | 437/192 |
| 5,616,511 | 4/1997 | Hirota | 438/396 |
| 5,623,243 | 4/1997 | Watanabe et al. | 257/309 |
| 5,639,689 | 6/1997 | Woo | 438/398 |
| 5,661,340 | 8/1997 | Ema et al. | 257/680 |
| 5,663,085 | 9/1997 | Tanigawa | 438/255 |
| 5,753,559 | 5/1998 | Yew et al. | 438/398 |
| 5,821,152 | 10/1998 | Han et al. | 438/255 |
| 5,830,793 | 11/1998 | Schuegraf et al. | 438/255 |

FOREIGN PATENT DOCUMENTS

4286151 A    10/1992    Japan .

OTHER PUBLICATIONS

H. Watanabe et al., *Hemispherical Grained Silicon (HSG–Si) Formation On In–Situ Phosphorous Doped Amorphous–Si Using The Seeding Method*, Extended Abstracts of the 1992 International Conference in Solid State Devices and Materials, Tsukuba, Aug. 26–28, 1992, pp. 422–424.

H. Watanabe et al., *An Advanced Fabrication Technology Of Hemispherical Grained (HSG) Poly–Si For High Capacitance Storage Electrodes*, Extended Abstracts of the 1991 International Conference on Solid State Devices and Materials, Yokohama, Aug. 27–29, 1991, pp. 478–480.

H. Watanabe et al., *A New Cylindrical Capacitor Using Hemispherical Grained Si (HSG–Si) For 256Mb DRAMs*, 1992 IEEE, IEDM 92, 10.1.1–10.1.4, pp. 259–262.

*Primary Examiner*—Tuan H. Nguyen
*Attorney, Agent, or Firm*—Myers Bigel Sibley & Sajovec

[57] ABSTRACT

A method of forming a hemispherical grained silicon layer includes the step of forming a first amorphous silicon layer on an integrated circuit substrate by exposing the integrated circuit substrate to a first atmosphere including a silicon source gas and an anti-nucleation gas. A hemispherical grained silicon layer is formed on the amorphous silicon layer opposite the substrate. The anti-nucleation gas can be nitrogen oxide or oxygen.

30 Claims, 2 Drawing Sheets

METHODS OF FORMING HEMISPHERICAL GRAINED SILICON LAYERS INCLUDING ANTI-NUCLEATION GASES

FIELD OF THE INVENTION

The present invention relates to the field of integrated circuits and more particularly to methods of forming hemispherical grained silicon layers for integrated circuit devices.

BACKGROUND OF THE INVENTION

As dynamic random access memory (DRAM) devices become more highly integrated, the memory cells therein become smaller. More particularly, a smaller area is available for each memory cell capacitor. Because the capacitance of a capacitor is directly proportional to the surface area of the electrodes of the capacitor, there exists a need to obtain increased capacitance from capacitors occupying smaller portions of the substrate.

In a dynamic random access memory device, the operation of a memory cell improves as the capacitance of the memory cell capacitor increases. As discussed above, the memory cell capacitance is proportional to the surface area of the storage electrode. Accordingly, the surface area of the storage electrodes should be increased to increase the capacitance of the memory cell capacitor and thus the performance of the memory cell.

Storage electrode surface areas have been increased by forming storage electrodes having three-dimensional structures. For example, cylindrical and fin type storage electrode structures have been proposed. Methods for forming storage electrodes having three-dimensional structures, however, may be complex, and undesirable step differences may be produced between a cell array region and a periphery region. These step differences may be sufficiently large that photolithographically formed patterns may have reduced resolution.

Storage electrode surface areas have also been increased by forming a hemispherical grain (HSG) silicon layer on the surface of the storage electrode. Steps of a method for forming a hemispherical grained silicon layer on a storage electrode according to the prior art are illustrated in FIGS. 1 and 2. In a dynamic random access memory device, a memory cell access transistor is formed on a semiconductor substrate 1. An insulating layer 3 is then formed on the semiconductor substrate 1 and the memory cell access transistor. Moreover, a contact hole is formed through the insulating layer 3 using photolithographic and etch steps to expose a source/drain region of the memory cell access transistor in the substrate 1.

The exposed surface portions of the semiconductor substrate 1 may have a crystal structure different than that of the bulk region of the semiconductor substrate 1 as well as a higher bonding energy due to damage caused during the etch step. In particular, a dry etch step and a wet etch step may damage the exposed portion of the substrate and impurities may be absorbed from the air.

An amorphous silicon layer is formed on the insulating layer 3 wherein the amorphous silicon layer fills the contact hole. The amorphous silicon layer can be formed by reacting a silicon source gas such as silane ($SiH_4$) or disilane ($Si_2H_6$) with a dopant gas such as phosphine ($PH_3$) at a temperature in the range of 480° C. to 550° C. At an initial stage of forming the amorphous silicon layer, a plurality of silicon nuclei may be formed at the bottom of the contact hole as indicated by the reference character A of FIG. 1. These silicon nuclei may result because the bonding energy of the surface of the semiconductor substrate 1 exposed through the contact hole may be high. The amorphous silicon layer is then patterned to provide a capacitor storage electrode 5 on the insulating layer 3 and in the contact hole. Accordingly, the capacitor storage electrode 5 is coupled to the source/drain region of the memory cell access transistor.

The structure including the capacitor storage electrode 5 is then loaded into a sealed chamber or furnace. This structure is heat processed at a temperature in the range of 600° C. to 620° C. and a silicon source gas is injected to form silicon nuclei on the amorphous storage electrode 5. The structure is then annealed without injecting the silicon source gas to grow the silicon nuclei thereby forming a hemispherical grained (HSG) polysilicon layer 7. This HSG polysilicon layer 7 thus increases the surface area of the amorphous silicon capacitor storage electrode 5.

The silicon nuclei formed at the bottom of the amorphous silicon lo layer adjacent the semiconductor substrate 1, however, may grow so that crystallization occurs through the amorphous silicon up to the surface of the capacitor storage electrode 5 as indicated by reference B of FIG. 2. The HSG polysilicon layer 7, however, may form only on amorphous portions of the capacitor storage electrode 5. In other words, the HSG polysilicon layer 7 may is not sufficiently form on the silicon grains B of FIG. 2 because the bonding energy of the silicon atoms within the silicon grains B may be so high that the silicon nuclei are not formed thereon. Even if silicon nuclei are formed on the silicon grains B, the silicon atoms within the silicon grains B may not migrate sufficiently so that the silicon nuclei do not grow normally.

Because the HSG polysilicon layer may not form uniformly across the storage electrode, the surface area of the storage electrode may not be sufficiently increased. Accordingly, there continues to exist a need in the art for improved methods of forming hemispherical grained silicon layers.

SUMMARY OF THE INVENTION

It is therefore an object of the present invention to provide improved methods of forming hemispherical grained silicon layers.

It is another object of the present invention to provide capacitors having increased capacitance.

It is still another object of the present invention to provide methods of forming integrated circuit memory devices having improved performance.

These and other objects are provided according to the present invention by methods of forming hemispherical grained silicon layers including the step of forming a first amorphous silicon layer on an integrated circuit substrate wherein the integrated circuit substrate is exposed to a first atmosphere including a silicon source gas and an anti-nucleation gas. A hemispherical grained silicon layer is then formed on the amorphous silicon layer opposite the substrate. By providing the anti-nucleation gas during the formation of the amorphous silicon layer, the formation of silicon nuclei at the interface between the substrate and the amorphous silicon layer can be reduced so that silicon grains at the surface of the amorphous silicon layer can be reduced. By reducing the formation of silicon grains at the surface of the amorphous silicon layer, a more uniform hemispherical grained silicon layer can be provided thereon. Accordingly, the surface area of the amorphous silicon layer can be increased thereby increasing the surface area of a capacitor electrode formed from the amorphous silicon layer.

More particularly, the anti-nucleation gas can be a gas such as nitrogen oxide or oxygen. In addition, the step of forming the hemispherical grained silicon layer can be preceded by the step of forming a second amorphous silicon layer on the first amorphous silicon layer. This second amorphous silicon layer can be formed by exposing the integrated circuit substrate to a second atmosphere including the silicon source gas wherein the second atmosphere does not include the anti-nucleation gas. Accordingly, the resistivity of the overall amorphous silicon layer can be reduced. Moreover, the hemispherical grained silicon layer can be a hemispherical grained polysilicon layer.

The silicon source gas can be silane or disilane, and the first amorphous silicon layer can have a thickness in the range of 800 Angstroms to 1,200 Angstroms. The first amorphous silicon layer can be formed at a temperature in the range of 450° C. to 550° C., and the first atmosphere can also include a dopant gas such as phosphine, arsine, or diborane.

In addition, a dielectric layer can be formed on the hemispherical grained silicon layer, and a conductive layer can be formed on the dielectric layer opposite the hemispherical grained silicon layer to complete the capacitor structure. Moreover, the step of forming the first amorphous silicon layer can be preceded by the steps of forming a memory cell access transistor on the integrated circuit substrate, and forming an insulating layer on the integrated circuit substrate and on the memory cell access transistor wherein the insulating layer has a contact hole therein exposing a portion of the memory cell access transistor. Accordingly, the first amorphous silicon layer can be formed on the insulating layer and in the contact hole so that the amorphous silicon layer provides a storage electrode of a memory cell capacitor for a dynamic random access memory device.

According to methods of the present invention, the uniformity of a hemispherical grained silicon layer can be increased thereby increasing the surface area of a memory cell capacitor storage electrode, and improving the performance of a dynamic random access memory device.

DETAILED DESCRIPTION

Figure 1:
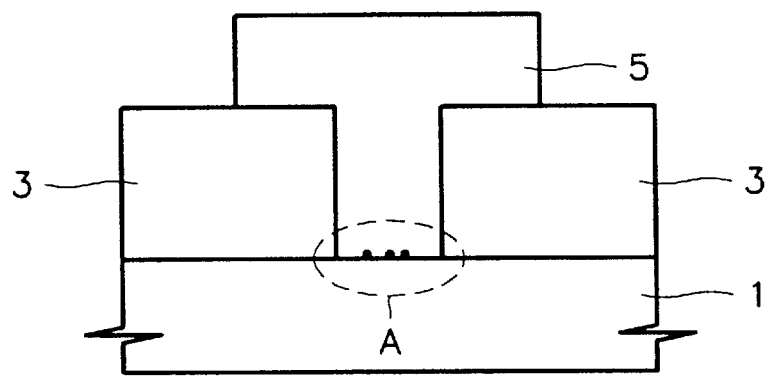
FIGS. 1 and 2 are cross-sectional views illustrating steps of a method of forming a capacitor according to the prior art.
Figure 2:
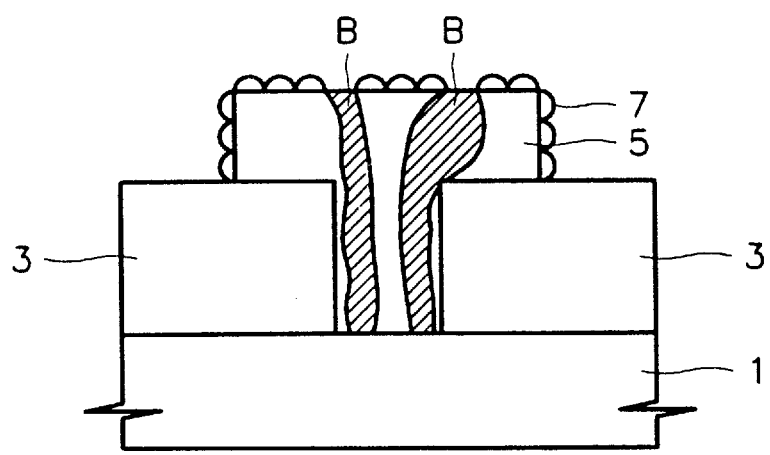

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present.

Figure 3:
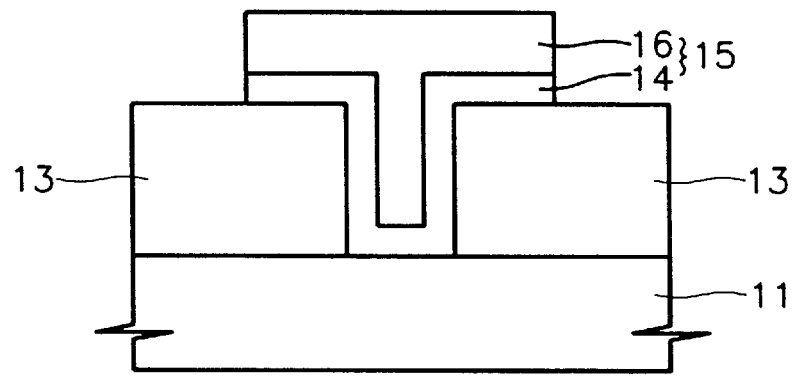
FIGS. 3 and 4 are cross-sectional views illustrating steps of a method of forming a capacitor according to the present invention.
Figure 4:
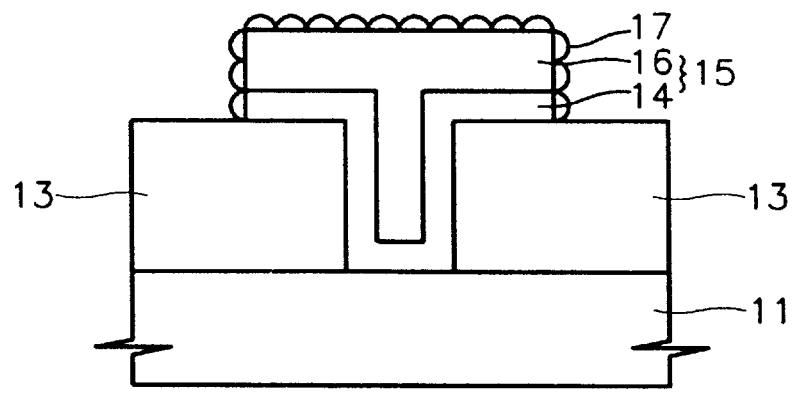

A method for forming a storage electrode for a capacitor according to the present invention will now be discussed with reference to FIGS. 3 and 4. A memory cell access transistor is formed on a semiconductor substrate 11, and an insulating layer 13 is formed on the substrate 11 and on the memory cell access transistor. The insulating layer 13 is patterned to provide a contact hole therethrough exposing a source/drain region of the memory cell access transistor in the semiconductor substrate 11. An amorphous silicon layer is formed on the insulating layer 13 and in the contact hole.

The step of forming the amorphous silicon layer includes the steps of loading the substrate including the insulating layer 13 with the contact hole into a chamber or a furnace where a first amorphous silicon layer 14 is formed having a predetermined thickness which can be in the range of 800 Angstroms to 1,200 Angstroms. The first amorphous silicon layer 14 is formed by injecting a silicon source gas, a dopant gas, and an anti-nucleation gas into the reaction chamber or furnace while heating the substrate to a predetermined temperature. A second amorphous silicon layer 16 is formed on the first amorphous silicon layer 14 by injecting the silicon source gas and the dopant gas into the reaction chamber or furnace at the predetermined temperature without injecting the anti-nucleation gas. The predetermined temperature is preferably in the range of 450° C. to 550° C. during the formation of the amorphous silicon layers. The silicon source gas can be silane ($SiH_4$) or disilane ($Si_2H_6$), and the dopant gas can be phosphine ($PH_3$), arsine ($AsH_3$) or diborane ($B_2H_6$). In addition, the anti-nucleation gas can be nitrogen oxide ($N_2O$) or oxygen ($O_2$). When silane gas is used as the silicon source gas and oxygen is used as the anti-nucleation gas, it is preferable to adjust the flow rates thereof so that the silane source gas has a flow rate in the range of 500 sccm to 1,500 sccm, and so that the oxygen anti-nucleation gas has a flow rate in the range of 1 sccm to 100 sccm.

If too much oxygen gas is injected, an oxide film may form on the exposed portion of the semiconductor substrate thus increasing the contact resistance between the semiconductor substrate 11 and the amorphous silicon layer. Accordingly, a relatively low flow of oxygen relative to the flow of silane should be injected. If the oxygen is injected during the formation of the first amorphous silicon layer 14, the formation of the silicon nuclei on the exposed portion of the semiconductor substrate 11 can be greatly reduced. In particular, the formation of the silicon nuclei on the exposed portion of the semiconductor substrate 11 can be reduced by forming the first amorphous silicon layer having a thickness in the range of 800 Angstroms to 1,200 Angstroms. In addition, it may be preferable to reduce the resistivity of the second amorphous silicon layer 16 by stopping the flow of oxygen during the formation of the second amorphous silicon layer 16.

Figure 5:
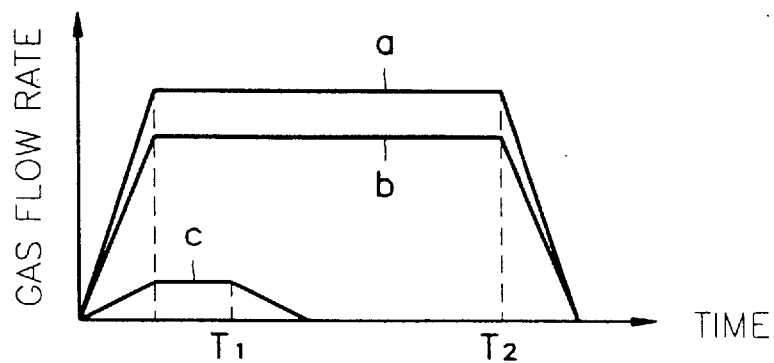
FIG. 5 is a graph illustrating gas flow rates over time for process gases used to form storage electrodes for capacitors according to the present invention.

FIG. 5 is a graph illustrating flow rates of the process gases when forming the amorphous silicon layers. The X-axis indicates time, and the Y-axis indicates the flow rate. Moreover, the reference characters a, b, and c represent the flow rates of the silicon source gas, the dopant gas, and the anti-nucleation gas respectively. As shown, the length of time T1 during which the anti-nucleation gas is injected is shorter than the length of time T2 during which the silicon source gas and the dopant gas are injected. The time T1 indicates the time over which the first amorphous silicon layer is formed by injecting the anti-nucleation gas. This period of time T1 can be sufficient to provide a first amorphous silicon layer having a thickness in the range of 800 Angstroms to 1,200 Angstroms. The amorphous silicon layers 14 and 16 are then photolithographically patterned to provide the capacitor storage electrode 15.

The structure including capacitor storage electrode 15 is then heated in a reaction chamber or furnace at a temperature in the range of 600° C. to 620° C., and a silicon source gas such as silane or disilane is injected to form a plurality of silicon nuclei on the amorphous silicon capacitor storage electrode 15. The structure is then annealed without injecting the silicon source gas to form the HSG polysilicon layer 17. In other words, the annealing step causes the silicon nuclei to grow into the hemispherical grained polysilicon layer 17.

The patterned amorphous silicon layers 14 and 16 with the hemispherical grained polysilicon layer 17 thereon can thus provide a capacitor storage electrode electrically coupled to a memory cell access transistor through the contact hole in the insulating layer 13. Because the presence of silicon nuclei at the interface between the first amorphous silicon layer 14 and the semiconductor substrate 11 has been reduced, the formation of silicon grains at the surface of the amorphous silicon capacitor storage electrode 15 is reduced. Accordingly, the HSG polysilicon layer 17 can be formed uniformly across the surface of the capacitor storage electrode. A dielectric layer is then formed on the HSG polysilicon layer, and a plate electrode is formed on the dielectric layer opposite the HSG polysilicon layer to provide a memory cell capacitor.

As discussed above, the formation of silicon nuclei on the semiconductor substrate can be suppressed by injecting a small amount of oxygen when forming the amorphous silicon layer. Accordingly, a HSG polysilicon layer can be formed uniformly over the entire surface of the amorphous silicon capacitor electrode. The surface area of the capacitor electrode can thus be increased. Capacitors suitable for use in highly integrated memory devices can thus be provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a hemispherical grained silicon layer comprising the steps of:

forming a first amorphous silicon layer on an integrated circuit substrate by exposing said integrated circuit substrate to a first atmosphere including a silicon source gas and an anti-nucleation gas; and forming a hemispherical grained silicon (HSG) layer on said amorphous silicon layer opposite said substrate.

2. A method according to claim 1 wherein said anti-nucleation gas comprises a gas chosen from the group consisting of nitrogen oxide ($N_2O$) and oxygen ($O_2$).

3. A method according to claim 1 wherein said step of forming said hemispherical grained silicon layer is preceded by the step of:

forming a second amorphous silicon layer on said first amorphous silicon layer opposite said substrate by exposing said integrated circuit substrate to a second atmosphere including said silicon source gas but not including said anti-nucleation gas.

4. A method according to claim 1 wherein said hemispherical grained silicon layer comprises a hemispherical grained polysilicon layer.

5. A method according to claim 1 wherein said silicon source gas comprises a gas chosen from the group consisting of silane ($SiH_4$) and disilane ($Si_2H_6$).

6. A method according to claim 1 wherein said first amorphous silicon layer has a thickness in the range of 800 Angstroms to 1200 Angstroms.

7. A method according to claim 1 wherein said step of forming said first amorphous silicon layer is performed at a temperature in the range of about 450° C. to 550° C.

8. A method according to claim 1 wherein said first atmosphere comprises a dopant gas.

9. A method according to claim 8 wherein said dopant gas comprises a gas chosen from the group consisting of phosphine ($PH_3$), arsine ($AsH_3$), and diborane ($B_2H_6$).

10. A method according to claim 1 further comprising the steps of:

forming a dielectric layer on said hemispherical grained silicon layer; and forming a conductive layer on said dielectric layer opposite said hemispherical grained silicon layer.

11. A method according to claim 10 wherein said step of forming said first amorphous silicon layer is preceded by the steps of:

forming a memory cell access transistor on said integrated circuit substrate; and forming an insulating layer on said integrated circuit substrate and on said memory cell access transistor wherein said insulating layer has a contact hole therein exposing a portion of said memory cell access transistor and wherein said first amorphous silicon layer is formed on said insulating layer and in said contact hole.

12. A method of forming a capacitor comprising the steps of:

forming a first amorphous silicon layer on an integrated circuit substrate by exposing said integrated circuit substrate to a first atmosphere including a silicon source gas and an anti-nucleation gas;

forming a hemispherical grained silicon (HSG) layer on said amorphous silicon layer opposite said substrate;

forming a dielectric layer on said hemispherical grained silicon layer; and forming a conductive layer on said dielectric layer opposite said hemispherical grained silicon layer.

13. A method according to claim 12 wherein said anti-nucleation gas comprises a gas chosen from the group consisting of nitrogen oxide ($N_2O$) and oxygen ($O_2$).

14. A method according to claim 12 wherein said step of forming said hemispherical grained silicon layer is preceded by the step of:

forming a second amorphous silicon layer on said first amorphous silicon layer opposite said substrate by exposing said integrated circuit substrate to a second atmosphere including said silicon source gas but not including said anti-nucleation gas.

15. A method according to claim 12 wherein said hemispherical grained silicon layer comprises a hemispherical grained polysilicon layer.

16. A method according to claim 12 wherein said silicon source gas comprises a gas chosen from the group consisting of silane ($SiH_4$) and disilane ($Si_2H_6$).

17. A method according to claim 12 wherein said first amorphous silicon layer has a thickness in the range of 800 Angstroms to 1200 Angstroms.

18. A method according to claim 12 wherein said step of forming said first amorphous silicon layer is performed at a temperature in the range of 450° C. to 550° C.

19. A method according to claim 12 wherein said first atmosphere comprises a dopant gas.

20. A method according to claim 19 wherein said dopant gas comprises a gas chosen from the group consisting of phosphine ($PH_3$), arsine ($AsH_3$), and diborane ($B_2H_6$).

21. A method according to claim 12 wherein said step of forming said first amorphous silicon layer is preceded by the steps of:

forming a memory cell access transistor on said integrated circuit substrate; and forming an insulating layer on said integrated circuit substrate and on said memory cell access transistor wherein said insulating layer has a contact hole therein exposing a portion of said memory cell access transistor and wherein said first amorphous silicon layer is formed on said insulating layer and in said contact hole.

22. A method of forming an integrated circuit memory device comprising the steps of:

forming a memory cell access transistor on an integrated circuit substrate;

forming an insulating layer on said integrated circuit substrate and on said memory cell access transistor wherein said insulating layer has a contact hole therein exposing a portion of said memory cell access transistor;

forming an first amorphous silicon layer on said insulating layer and in said contact hole by exposing said integrated circuit substrate to a first atmosphere including a silicon source gas and an anti-nucleation gas;

forming a hemispherical grained silicon (HSG) layer on said amorphous silicon layer opposite said substrate;

forming a dielectric layer on said hemispherical grained silicon layer; and forming a conductive layer on said dielectric layer opposite said hemispherical grained silicon layer.

23. A method according to claim 22 wherein said anti-nucleation gas comprises a gas chosen from the group consisting of nitrogen oxide ($N_2O$) and oxygen ($O_2$).

24. A method according to claim 22 wherein said step of forming said hemispherical grained silicon layer is preceded by the step of:

forming a second amorphous silicon layer on said first amorphous silicon layer opposite said substrate by exposing said integrated circuit substrate to a second atmosphere including said silicon source gas but not including said anti-nucleation gas.

25. A method according to claim 22 wherein said hemispherical grained silicon layer comprises a hemispherical grained polysilicon layer.

26. A method according to claim 22 wherein said silicon source gas comprises a gas chosen from the group consisting of silane ($SiH_4$) and disilane ($Si_2H_6$).

27. A method according to claim 22 wherein said first amorphous silicon layer has a thickness in the range of 800 Angstroms to 1200 Angstroms.

28. A method according to claim 22 wherein said step of forming said first amorphous silicon layer is performed at a temperature in the range of 450° C. to 550° C.

29. A method according to claim 22 wherein said first atmosphere comprises a dopant gas.

30. A method according to claim 29 wherein said dopant gas comprises a gas chosen from the group consisting of phosphine ($PH_3$), arsine ($AsH_3$), and diborane ($B_2H_6$).

* * * * *